(12) United States Patent
Benkhoff et al.

(10) Patent No.: US 7,727,702 B2
(45) Date of Patent: Jun. 1, 2010

(54) METHOD OF COLORING A COATING COMPOSITION

(75) Inventors: Johannes Benkhoff, Basel (CH); Karin Powell, Lörrach (DE)

(73) Assignee: Ciba Specialty Chemicals Corp., Tarrytown, NY (US)

( * ) Notice: Subject to any disclaimer, the term of this patent is extended or adjusted under 35 U.S.C. 154(b) by 792 days.

(21) Appl. No.: 11/547,153

(22) PCT Filed: Mar. 29, 2005

(86) PCT No.: PCT/EP2005/051406

§ 371 (c)(1), (2), (4) Date: Sep. 29, 2006

(87) PCT Pub. No.: WO2005/097876

PCT Pub. Date: Oct. 20, 2005

(65) Prior Publication Data

US 2007/0207925 A1  Sep. 6, 2007

(30) Foreign Application Priority Data

Apr. 7, 2004 (EP) .................................. 04101441

(51) Int. Cl.
*G03F 7/00* (2006.01)
*G03F 7/004* (2006.01)
*G03F 7/20* (2006.01)

(52) U.S. Cl. .............................. 430/270.1; 430/270.15; 430/905; 430/945

(58) Field of Classification Search .............. 430/270.1, 430/270.15, 905, 945
See application file for complete search history.

(56) References Cited

U.S. PATENT DOCUMENTS

| | | | |
|---|---|---|---|
| 3,121,632 A | 2/1964 | Sprague et al. ............. 430/337 |
| 4,923,781 A | 5/1990 | Fujikura et al. .......... 430/281.1 |
| 4,940,649 A | 7/1990 | Aldag et al. ............. 430/281.1 |
| 5,387,798 A | 2/1995 | Funakoshi et al. ........ 250/474.1 |
| 5,581,090 A | 12/1996 | Goudjil .................... 250/474.1 |
| 5,677,107 A | 10/1997 | Neckers ...................... 430/469 |
| 6,040,040 A * | 3/2000 | Rainbow .................... 428/32.6 |
| 6,207,344 B1 * | 3/2001 | Ramlow et al. ........... 430/270.1 |
| 6,255,659 B1 | 7/2001 | Sandison .................. 250/474.1 |
| 6,451,879 B1 * | 9/2002 | Mori et al. ................... 523/458 |
| 6,531,076 B2 * | 3/2003 | Crano et al. ................. 252/586 |
| 6,689,619 B2 * | 2/2004 | Elhard et al. ................. 436/166 |
| 6,825,265 B2 * | 11/2004 | Daga et al. ................... 524/544 |
| 6,890,399 B2 * | 5/2005 | Wojciak ................... 156/275.5 |
| 7,033,677 B2 * | 4/2006 | Busch et al. ................. 428/515 |
| 7,148,182 B2 * | 12/2006 | Field et al. .................. 503/201 |
| 2004/0152008 A1 | 8/2004 | Heneghan et al. ......... 430/270.1 |
| 2005/0239650 A1 * | 10/2005 | Field et al. ................... 503/226 |
| 2006/0109531 A1 * | 5/2006 | Watanabe et al. ............... 359/2 |
| 2006/0154818 A1 | 7/2006 | Destro et al. ................ 503/201 |

FOREIGN PATENT DOCUMENTS

| | | |
|---|---|---|
| EP | 0 291 880 | 11/1988 |
| EP | 0 562 201 | 9/1993 |
| WO | 02/101462 | 12/2002 |
| WO | 2004/052654 | 6/2004 |

* cited by examiner

*Primary Examiner*—Amanda C. Walke
(74) *Attorney, Agent, or Firm*—Joseph C. Suhadolnik

(57) ABSTRACT

A method is provided for irreversibly coloring a coating composition containing a color former comprising the steps of
a) providing a coating composition that contains an UV curable resin, a thermosetting resin or an alkyd resin with the proviso that the coating composition contains no developer nor any additive which may function as developer;
b) mixing the coating composition with the color former whereby no color is formed;
c) applying the colorless composition obtained in step b) to a substrate;
d) in case of a thermosetting resin curing the resin between 100 and 300° C., preferably between 100 and 150° C., whereby no color is formed, in case of alkyd resin drying of the resin at room temperature, whereby no color is formed;
e) exposure to UV or high energy radiation below 400 nm whereby the color is formed.

10 Claims, No Drawings

METHOD OF COLORING A COATING COMPOSITION

The present application relates to a method of coloring a coating composition by irradiation with UV or high energy radiation without the need of a developer.

Colorless chromogenic compounds produce color when in contact with an acidic substance such as an organic acid, acid clay, phenol-formaldehyde resins, metal salts of aromatic carboxylic acids and bisphenol A.

The International Publication WO 02/101462 describes a method for coloring a polymeric material containing a latent acid and a color former by irradiation with UV-light.

The International Publication WO 04/052654 describes a method of coloring a polymeric material containing a phenolic antioxidant and/or a phenolic UV absorber as latent acid by irradiation using UV or high energy radiation.

U.S. Pat. No. 4,923,781 describes a photopolymerizable composition containing a functional monomer, preferably a (meth)acrylate monomer; 3,6-diamine fluorans as color formers, a photoinitiator and an organic halogen compound capable of causing the color former to form a color by irradiation.

It has been found that the color formers as described in WO02/101462, especially fluoran color formers can be irreversibly developed on exposure to UV or high energy radiation either completely or through a mask or via UV laser imaging without the need to use any additional developer. The system is thermally stable up to 300° C. Only when using appropriate radiation, the color can be developed instantaneously, within fractions of seconds. Thus, a colored part or a colored image is obtained.

The method is especially suitable for spontaneous in depth coloring of a coating composition, having the advantage that the image obtained cannot be removed without disturbing the coating.

If UV-curable coating compositions are used containing a photoinitiator, the curing and imaging process is effected in one step. Due to the immediate and intense color formation under UV curing conditions, the system can serve as indicator (process chemical) in UV curable formulations to visualize sufficient UV exposure in UV curing processes.

If thermal curable coating compositions are used, the curing step is separated from the color developing step. During curing no color is developed.

Due to much slower color formation under artificial or natural daylight (within hours) the system may serve as a detector/recorder for identification of total UV exposure/dosage.

Thus, the invention relates to a method of irreversibly coloring a coating composition containing a color former comprising the steps of a) providing a coating composition that contains an UV curable resin, a thermosetting resin or an alkyd resin with the proviso that the coating composition contains no developer nor any additive which may function as developer;
b) mixing the coating composition with the color former whereby no color is formed;
c) applying the colorless composition obtained in step b) to a substrate;
d) in case of a thermosetting resin curing the resin between 100 and 300° C., preferably between 100 and 150 ° C., whereby no color is formed, in case of alkyd resin drying of the resin at room temperature, whereby no color is formed;
e) exposure to UV or high energy radiation below 400 nm whereby the color is formed.

UV-curable resins include polymers, oligomers or monomers selected from, for example, (meth)acrylate monomers, oligomers and polymers and copolymers, including urethane acrylates, epoxy acrylates, polyester acrylates, elastomeric (meth)acrylates, including mono, di, tri and tetra functional monomers or related oligomeric or polymeric compositions which optionally may be end-capped with monomeric units containing polymerizable double bonds, especially including vinyl or vinyl-type monomers, oligomers and polymers including those based on vinyl chloride, vinyl alcohol, vinyl acetate and related vinyl monomers, oligomers and polymers. Preferred are acrylic resins having a low acid number (<15 mg KOH/g ), preferably below 3 mg KOH/g.

A photopolymerization initiator can be employed in combination with these oligomers and monomers. Furthermore a surfactant can be present. Photoinitiators which may function as developers are excluded. Examples of such photoinitiators which are excluded are photolatent acids such as organic halogen compounds, especially trihalomethyl sulfones, phenyl trihalomethyl ketones, trihalomethyltriazines, or photolatent acids such as jodonium salts, onium salts, 6-nitrobenzylsulfonates, bis-sulfonyidiazomethane compounds, oxime sulfonates, etc. Examples of known photolatent acids for chemically enhanced photoresists are to be found, for example, in U.S. Pat. Nos. 5,731,364, 5,800,964, EP 704762, U.S. Pat. Nos. 5,468,589, 5,558,971, 5,558,976 and especially EP 794457 and EP 795786.

The thermosetting resin includes alkyd resins, acrylic resins, polyester resins, epoxy resins, phenolic resins, amino resins including melamines, silicones and polyurethanes and mixtures thereof. Acrylic thermosetting resins with a low acid number (<15 mg KOH/g ) are preferably employed.

Optionally a solvent such as butylacetate, butanol, isobutanol or aromatic hydrocarbons such as e.g. Solvesso 150 manufactured by Exxon Mobile Chemical, may be present. Optionally flow improvers may be present.

The alkyd resin is preferably a long oil alkyd resin and may contain siccatives. Furthermore anti skinning agents and inert solvents such as, for example, petroleum fractions such as Exxol or Varsol, both commercial products of Exxon, or else other inert hydrocarbons. The acid value of the whole resin system should be below 15 mg KOH/g Alkyd resins are prepared by esterification of a polybasic acid with a polyhydric alcohol to yield a thermosetting hydroxycarboxylic resin. Glycerol and pentaerythritol are the most common polyhydric alcohols for alkyd resins. Polyols such as sorbitol and diethylene glycol may also be used. The most important polybasic acids for alkyd resins are phthalic acid and isophthalic acid. Other dibasic acids used in alkyd resins to impart special properties are adipic acid, azelaic acid, sebacic acid, tetrachlorophthalic anhydride, and chlorendic anhydride. Even if the alkyd resins have acid numbers between 2 and 15, the acid part in the alkyd resin is not active, in other words mixing the color developer with the alkyd resin does not form a color.

All resins (UV curable resin, thermosetting resin or alkyd resin) contain only a color former but neither a developer nor any additive, which may function as developer.

The term "developer" includes all the acidic substances serving as an electron acceptor in conventional thermosensitive recording materials, such as inorganic acids, aromatic carboxylic acids or anhydrides thereof, organic sulfonic acids, other organic acids, and phenolic compounds.

and/or "latent acid developer" which are compounds, which are not acids per se and contain a proton, which can be split off by irradiation.

Examples for latent acid developers are given in WO02/101462, wherein latent acids of the formula (1) are disclosed.

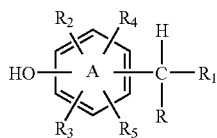
(1)

wherein ring A can contain one or more hetero atoms and/or can contain an anelated ring, $R_1$ is hydrogen, alkyl, preferably $C_1$-$C_{20}$-alkyl, alkenyl, preferably $C_2$-$C_{20}$-alkenyl, aryl, preferably phenyl or phenyl which is substituted one to three times with $C_1$-$C_4$alkyl, or $C_1$-$C_4$alkoxy, $R_2$, $R_3$, $R_4$ and $R_5$ independently of each other are hydrogen or a functional substituent, and R stands for $C_1$-$C_6$alkyl, —$Z_1$-$Q_1$, or —$Z_2$-$Q_2$, wherein $Z_1$ is a single bond, S, NH or O, and $Q_1$ is a heterocyclic ring system having from 5 to 9 ring atoms selected from C, S, O and N, with at least 2, preferably at least 3, more preferably at least 4 carbon atoms in the ring system, preferably $Q_1$ stands for morpholine, pyridine, which may be substituted one to three times with $C_1$-$C_4$alkyl or hydroxy, mercaptobenzoxazole, mercaptobenzthiazole, and wherein $Z_2$ stands for $C_1$-$C_4$alkylene, which can be substituted by $C_1$-$C_4$alkyl or $Q_3$, wherein $Q_3$ stands for phenyl which can be substituted one to three times with $C_1$-$C_4$alkyl, hydroxy, $C_5$-$C_8$cycloalkyl and/or a heterocyclic ring system having from 5 to 9 ring atoms selected from C, S, O and N, with at least 2, preferably at least 3, more preferably at least 4 carbon atoms in the ring system, and $Q_2$ stands for phenyl which can be substituted one to three times with $C_1$-$C_4$alkyl, hydroxy, $C_5$-$C_8$cycloalkyl and/or a heterocyclic ring system having from 5 to 9 ring atoms selected from C, S, O and N, with at least 2, preferably at least 3, more preferably at least 4 carbon atoms in the ring system, with the proviso that the hydrogen atom at the C-atom in α-position to R can be split off by irradiation.

The term "latent acid developer" further refers to phenolic antioxidants as disclosed in the European Patent application EP03/50912. Typical examples are hydroxyphenyl-benzotriazole, hydroxyphenyl-triazine or hydroxybenzophenone classes, all comprising a hydroxyl group located on a phenyl ring in ortho-position relative to the phenyl ring's attachment of the core molecule.

The term "color formers" refers to fluorans, triphenylmethanes, lactones, benzoxazines, spiropyrans, phthalides; preferably fluorans.

Suitable color formers include but are not limited to: 3-dibutylamino-7-dibenzylaminofluoran, 3-diethylamino-6-methylfluoran, 3-dimethylamino-6-methyl-7-anilinofluoran, 3-diethylamino-6-methyl-7-anilinofluoran, 3-diethylamino-6-methyl-7-(2,4-dimethylanilino) fluoran, 3-diethyl-amino-6-methyl-7-chlorofluoran, 3-diethylamino-6-methyl-7-(3-trifluoromethylanilino)fluoran, 3-diethylamino-6-methyl-7-(2-chloroanilino)fluoran, 3-diethylamino-6-methyl-7-(4-chloroanilino)fluoran, 3-diethylamino-6-methyl-7-(2-fluoroanilino)fluoran, 3-diethylamino-6-methyl-7-(4-n-octylanilino)fluoran, 3-diethylamino-7-(4-n-octylanilino) fluoran, 3-diethylamino-6-methyl-7-(dibenzylamino) fluoran, 3-diethylamino-7-(dibenzylamino)fluoran, 3-diethylamino-6-chloro-7-methylfluoran, 3-diethylamino-7-t-butylfluoran, 3-diethylamino-7-carboxyethylfluoran, 3-diethylamino-6-chloro-7-anilinofluoran, 3-diethylamino-6-methyl-7-(3-methylanilino)fluoran, 3-diethylamino-6-methyl-7-(4-methylanilino)fluoran, 3-diethylamino-6-ethoxyethyl-7-anilinofluoran, 3-diethylamino-7-methylfluoran, 3-diethylamino-6,8-dimethylfluoran, 3-diethylamino-7-chlorofluoran, 3-diethylamino-7-chlorofluoran, 3-diethylamino-7-(3-trifluoromethylanilino) fluoran, 3-diethylamino-7-(2-chloroanilino)fluoran, 3-diethylamino-7-(2-fluoroanilino)fluoran, 3-diethylamino-benzofluoran, 3-diethylamino-benzofluoran, 3-dibutylamino-6-methyl fluoran, 3-dibutylamino-6-methyl-7-anilinofluoran, 3-dibutylamino-6-methyl-7-(2,4-dimethylanilino)-fluoran, 3-dibutylamino-6-methyl-7-(2-chloroanilino)fluoran, 3-dibutylamino-6-methyl-7-(4-chloroanilino)fluoran, 3-dibutylamino-6-methyl-7-(2-fluoroanilino)fluoran, 3-dibutylamino-6-methyl-7-(3-trifluoromethylanilino)fluoran, 3-dibutylamino-6-ethoxyethyl-7-anilinofluoran, 3-dibutylamino-6-chloro-anilinofluoran, 3-dibutylamino-6-methyl-7-(4-methylanilino)fluoran, 3-dibutyamino-7-(2-chloroanilino)fluoran, 3-dibutylamino-7-(2-fluoroanilino) fluoran, 3-dipentylamino-6-methyl-7-anilinofluoran, 3-dipentylamino-6-methyl-7-(4-2-chloroanilino)fluoran, 3-dipentylamino-7-(3-trifluoromethylanilino)fluoran, 3-dipentylamino-6-chloro-7-anilinofluoran, 3- dipentylamino-7-(4-chloroanilino)fluoran, 3-pyrrolidino-6-methyl-7-anilinofluoran, 3-piperidino-6-methyl-7-anilinofluoran, 3-(N-methyl-N-propylamino)-6-methyl-7-anilinofluoran, 3-(N-methyl-N-cyclohexylamino)-6-methyl-7-anilinofluoran, 3-(N-ethyl-N-cyclohexylamino)-6-methyl-7-anilinofluoran, 3-(N-ethyl-N-n-hexylamino)-7-anilinofluoran, 3-(N-ethyl-p-toluidino)amino-6-methyl-7-anilinofluoran, 3-(N-ethyl-p-toluidino)amino-7-methylfluoran, 3-(N-ethyl-N-isoamylamino)-6-methyl-7-anilinofluoran, 3-(N-ethyl-N-isoamylamino)-7-(2-chloroanilino)fluoran, 3-(N-ethyl-N-isoamylamino)-6-chloro-7-anilinofluoran, 3-(N-ethyl-N-tetrahydrofurfurylamino)-6-methyl-7-anilinofluoran, 3-(N-ethyl-N-isobutylamino)-6-methyl-7-anilinofluoran, 3-(N-butyl-N-isoamylamino)-6-methyl-7-anilinofluoran, 3-(N-isopropyl-N-3-pentylamino)-6-methyl7-anilinofluoran, 3-(N-ethyl-N-ethoxypropylamino)-6-methyl-7-anilinofluoran, 3-cyclohexylamino-6-chlorofluoran, 2-methyl-6-p-(p-dimethylaminophenyl)aminoanilinofluoran, 2-methoxy-6-p-(p-dimethylaminophenyl)aminoanilinofluoran, 2-chloro-3-methyl-6-p-(p-phenylaminophenyl)-aminoanilinofluoran, 2-diethylamino-6-p-(p-dimethylaminophenyl)aminoanilinofluoran, 2-phenyl-6-methyl-6-p-(p-phenylaminophenyl) aminoanilinofluoran, 2-benzyl-6-methyl-6-p-(p-phenyl-aminophenyl) aminoanilinofluoran, 3-methyl-6-p-(p-dimethylaminophenyl)aminoanilinofluoran, 3-diethylamino-6-p-(p-diethylaminophenyl)aminoanilinofluoran, 3-diethylamino6-p-(p-dibutyl-aminophenyl)aminoanilinofluoran, 2,4-dimethyl-6-[(4-dimethylamino)anilino]fluoran.

Especially preferred fluoran compounds are, 3-diethylamino-6-methylfluoran, 3-diethylamino-6-methyl-7-anilinofluoran, 3-diethylamino-6-methyl-7-(2,4-dimethylanilino)fluoran, 3-diethylamino-6-methyl-7-chlorofluoran, 3-diethylamino-6-methyl-7-(3-trifluoromethylanilino)fluoran, 3diethylamino-6-methyl-7-(2-chloroanilino)fluoran, 3-diethylamino-6-methyl-7-(4-chloroanilino)fluoran, 3-diethylamino-6-methyl-7-(2-fluoroanilino)fluoran, 3-diethylamino-7-(4-n-octylanilino)fluoran, 3-diethylamino-7-(dibenzylamino)fluoran, 3-diethylamino-6-chloro-7-methylfluoran, 3-diethylamino-7-t-butylfluoran, 3-diethylamino-7-carboxyethylfluoran, 3-diethylamino-6-chloro-7-anilinofluoran, 3-diethylamino-6-methyl-7-(3-methylanilino)fluoran, 3-diethylamino-6-methyl-7-(4-methylanilino)fluoran, 3-diethylamino-7-methylfluoran, 3-diethylamino-6,8-dimethylfluoran, 3-diethylamino-7-chlorofluoran, 3-diethylamino-7-(3-trifluoro-methylanilino) fluoran, 3-diethylamino-7-(2-chloroanilino)fluoran, 3-diethylamino-7-(2-fluoroanilino)fluoran, 3-diethylamino-benzo[a]fluoran-6-ethoxyethyl-7-anilinofluoran, 3-dibutylamino-6-chloro-anilinofluoran, 3-dipentylamino-6- methyl-7-anilinofluoran, 3-(N-methyl-N-propylmino)-6-methyl-7-anilinofluoran, 3-(N-methyl-N-cyclohexylamino)-6-methyl-7-anilinofluoran, 3-(N-ethyl-N-cyclohexylamino)-6-methyl-7-anilinofluoran, 3-(N-ethyl-N-n-hexylamino)-7-anilinofluoran, 3-(N-ethyl-p-toluidino)amino-6-methyl-7-anilinofluoran, 3-(N-ethyl-p-toluidino)amino-7-methylfluoran, 3-(N-ethyl-N-isoamylamino)-6-methyl-7-anilinofluoran, 3-(N-ethyl-N-tetrahydrofurfurylamino)-6-methyl-7-anilinofluoran, 3-(N-ethyl-N-isobutylamino)-6-methyl7-anilinofluoran, 3-(N-butyl-N-isoamylamino)-6-methyl-7-anilinofluoran, 3-(N-isopropyl-N-3-pentylamino)-6-methyl-7-anilinofluoran, 3-(N-ethyl-N-ethoxypropylamino)-6-methyl-7-anilinofluoran, 3-cyclohexylamino-6-chlorofluoran, 7-(N-ethyl-N-isopentylamino)-3-methyl-1-phenylspiro[4H-chromeno[2,3-c]pyrazole4(1H)-3'phthalide, Highly preferred fluoran compounds are, 3-diethylamino-6-methyl-7-anilinofluoran, 3-diethylamino-6-methyl-7-(2,4-dimethylanilino)fluoran, 3-diethylamino-6-methyl-7-chlorofluoran, 3-diethylamino-7-(4-n-octylanilino)fluoran, 3-diethylamino-7-(dibenzylamino)fluoran, 3-diethylamino-7-t-butylfluoran, 3-diethylamino-7-carboxyethylfluoran, 3-diethylamino-6,8-dimethylfluoran, 3-diethylamino-benzo[a]fluoran, 3-diethylamino-benzo[c]fluoran, 3-dibutylamino-6-methyl-7-anilinofluoran, 3-dipentylamino-6-methyl-7-anilinofluoran, 3-(N-methyl-N-propylamino)-6-methyl-7-anilinofluoran, 3-(N-methyl-N-cyclohexylamino)-6-methyl-7-anilinofluoran, 3-(N-ethyl-N-cycl, 3-(N-ethyl-p-toluidino)amino-7-methylfluoran, 3-(N-ethyl-N-isoamylamino)-6-methyl-7-anilinofluoran, 3-(N-ethyl-N-isobutylamino)-6-methyl-7-anilinofluoran, 3-(N-ethyl-N-ethoxypropylamino)-6-methyl-7-anilinofluoran, 3-cyclohexylamino-6-chlorofluoran, 7-(N-ethyl-N-isopentylamino)-3-methyl-1-phenylspiro[4H-chromeno[2,3-c]pyrazole4(1H)-3'phthalide.

The above color formers may be used as single compounds or in combination with each other or with further color forming compounds.

Commonly available fluorans included in the list above are:

Pergascript Black T-R, Pergascript Black T-2R, Pergascript Green 1-2GN, Pergascript Orange I-G, Pergascript blue I-2RN, and competitor products Orange DCF, Red DCF, Orange 100, Red PSD-V, Red ETPM.

The term "coating composition" is used to describe any composition which is applied to a substrate surface which produces a coating. Such composition may be aqueous or non-aqueous and may contain pre-polymerized polymers or polymerizable monomers, oligomers and/or polymers and optionally other additives including a surfactant and/or emulsifier and a solvent, among numerous other additives. The coating composition may also be an ink composition. Thus, the substrate is printed with an ink composition to form an ink film on the substrate.

Non limiting examples for inks are: inks for printing inks in printing processes, for flexographic printing, screen printing, packaging printing, security ink printing, intaglio printing or offset printing, for pre-press stages and for textile printing, for office, home applications or graphics applications, such as for paper goods, for example, for ballpoint pens, felt tips, fiber tips, card, wood, (wood) stains, metal, inking pads or inks for impact printing processes (with impact-pressure ink ribbons), for the preparation of non-impact-printing material for digital printing, for the thermal wax transfer printing process, the ink jet printing process or for the thermal transfer printing process, and also for the preparation of polymeric ink particles, toners, dye lasers, dry copy toners liquid copy toners, or electrophotographic toners, and electroluminescent devices.

Non limiting examples for coatings are: for industrial or commercial use, for textile decoration and industrial marking, for roller coatings or powder coatings or for automotive finishes, for high-solids (low-solvent), water-containing or metallic coating materials or for pigmented formulations for aqueous paints, for the preparation of pigmented plastics for coatings, fibers, platters or mold carriers.

The amount of color former in the coating composition usually is in the range of about 0,001 to 10% by weight, most preferably 0,01 to 5% by weight with respect to the total weight of the coating composition. The coating composition can contain mixtures of two or more color formers.

Suitable radiation sources include outdoor exposure, artificial daylight, UV light (wavelength ($\lambda$) shorter than 400 nm, preferably shorter than 380 nm), X-ray, $\gamma$-ray, or particle radiation such as electron beam. Preferred radiation sources include UV laser, UV lamp, X-ray or electron radiation sources, radioactive materials emitting $\alpha$-, $\beta$- and/or $\gamma$-radiation.

The color formers and optional further additives which do not function as developer may be added to the coating composition by known methods such as dry blending in the form of a powder, or wet mixing in the form of solutions, dispersions or suspensions for example in an inert solvent, water or oil.

Non acid additives may further be present such as solvents; photoinitiators; antioxidants (excluded those as described in WO04/052654 which act as latent acid); optical brighteners; fillers; thermal inhibitors which are intended to prevent premature polymerisation, for example 2,2,6,6-tetramethyl4-hydroxy-piperidin-1-oxyl (4-hydroxy-TEMPO) and derivatives thereof; antistatics; wetting agents or flow improvers and adhesion enhancers; UV absorbers and light stabilisers. Excluded are compounds that act as latent acid developer or acid developer as described above.

Non limiting examples of suitable substrates are, for example, wood, textiles, paper, ceramics, glass, glass fibres, plastics such as polyester, polyethylene terephthalate, polyolefins or cellulose acetate, especially in the form of films, and also metals such as Al, Cu, Ni, Fe, Zn, Mg or Co and GaAs, Si or $SiO_2$.

Color formation takes place under radiation. The color change is irreversible. A colored part or a colored image is obtained either completely or through a mask. The method is especially suitable for spontaneous in depth coloring of a coating composition, having the advantage that the image obtained cannot be removed without disturbing the coating.

If UV-curable coating compositions are used containing a photoinitiator, the curing and imaging process is effected in one step. Due to the immediate and intense color formation under UV curing conditions, the system can serve as indicator (process chemical) in UV curable formulations to visualize sufficient UV exposure in UV curing processes.

Due to much slower color formation under artificial or natural daylight (within hours) the system may serve as a detector/recorder for identification of total UV exposure/dosage.

EXAMPLES

1. List of Tested Colorformers

| Designation Color Former | Structure |
| --- | --- |
| CF1 | 3-diethylamino-7-(ethoxycarbonyl)fluoran structure |
| CF2 | Crystal Violet Lactone (CVL) structure |
| CF3 | 3-diethylamino-6-methyl-7-(2,4-dimethylanilino)fluoran structure |
| CF4 | 3-diethylamino-6-methyl-7-anilinofluoran structure |
| CF5 | 3-diethylamino-6-methyl-7-anilinofluoran structure |

-continued
| Designation Color Former | Structure |
|---|---|
| CF6 | 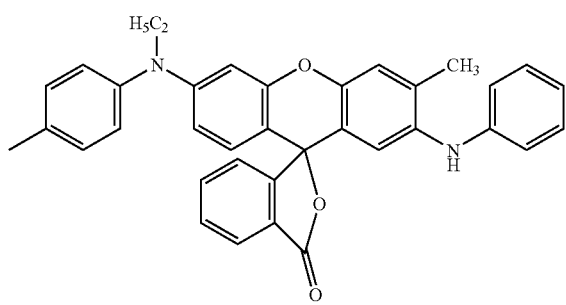 |
| CF7 | 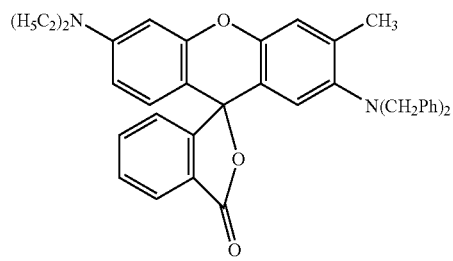 |
| CF8 | 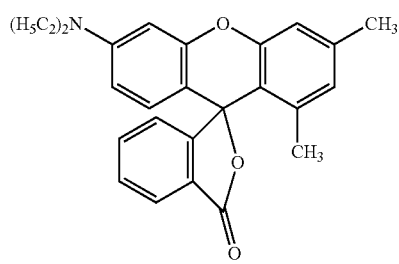 |
| CF9 | 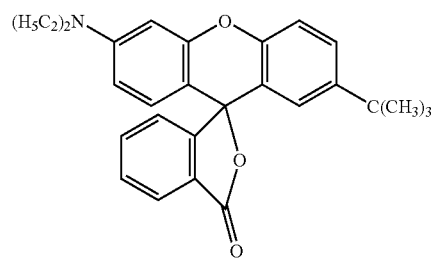 |
| CF10 | 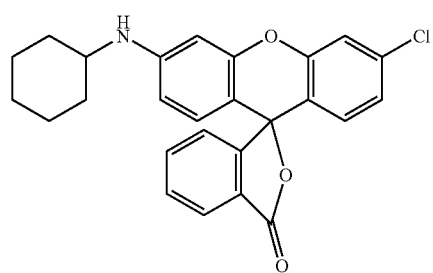 |

-continued
| Designation Color Former | Structure |
| --- | --- |
| CF11 | 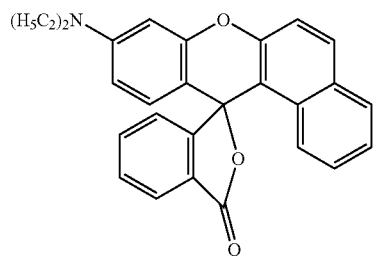 |
| CF12 | 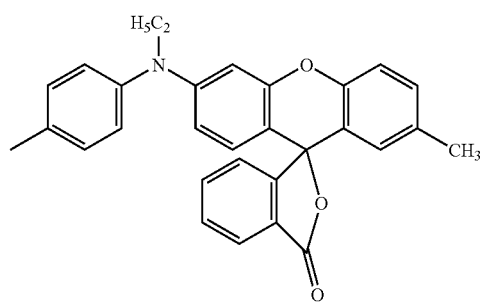 |
| CF13 | 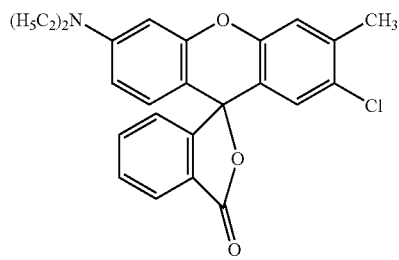 |
| CF14 | 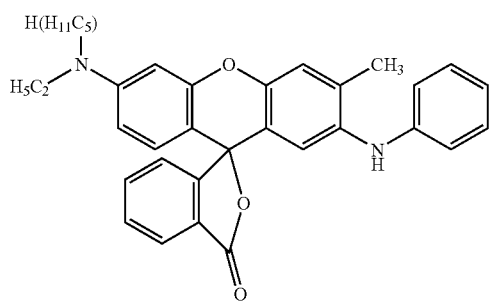 |
| CF15 | 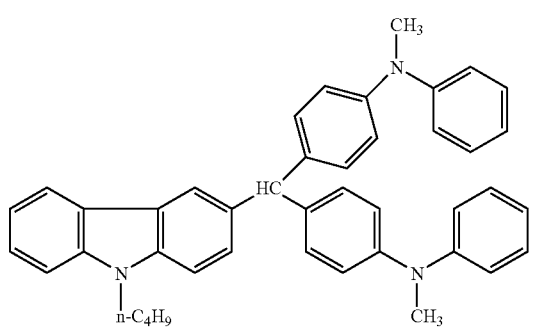 |

-continued

| Designation Color Former | Structure |
|---|---|
| CF16 | 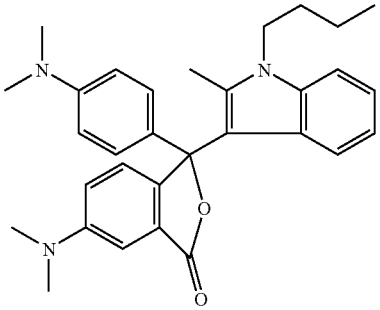 |
| CF17 | 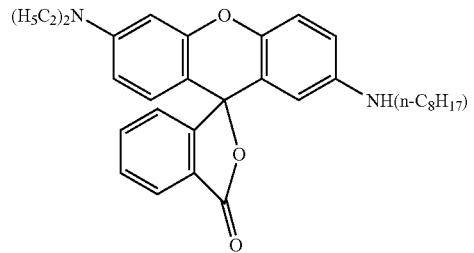 |

2. Test-Formulations, Application and Drying Conditions 2.1 UV-Curable System

| Substance | Supplier | Acid Value (solids) [mg KOH/g] | wt % |
|---|---|---|---|
| Ebecryl 284 | acrylated oligomers (UCB) | Not applicable* | 44.5 |
| Roskydal UA VP LS 2308 | isocyanato acrylate (Bayer) | Not applicable* | 34.2 |
| TMPTA | trimethylolpropane triacrylate (UCB) | | 10.0 |
| TPGDA | tripropyleneglycol diacrylate (UCB) | | 10.0 |
| Tego Glide 100 | Silicon-based surfactant (Tego) | | 0.5 |
| Irgacure 184 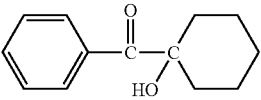 | Photoinitiator (Ciba) | | 3.0 |
| Color Former | Selected from table above | | 1.0 |
| Topanol CASF | Latent acid generator (Rutherford Chemicals) | | 1.0 |

*according to Material Safety Data Sheet of supplier
Sample was applied with wire bar (wet film thickness 60 μm) and cured by irradiation with 2 Hg-bulbs (each 80 W/cm), line speed 10 m/min.

2.2 Thermo Setting Acrylic System

| Substance | Supplier | Acid Value (solids) [mg KOH/g] | wt % |
|---|---|---|---|
| Viacryl SC 303/65 XB | acrylic resin, (UCB) | 10-15* | 27.51 |
| Viacryl SC 370/75 SNA | acrylic resin, (UCB) | 8-12* | 23.34 |
| MAPRENAL MF 650 55% IB | melamine resin (UCB) | <1** | 27.29 |
| Butylacetat/Butanol (37:8) | | | 4.33 |
| Isobutanol | | | 4.87 |
| Solvesso 150 | solvent (ExxonMobil Chemical) | | 2.72 |
| Terlitol 16/18 | solvent (Wenger-Lacke) | | 8.74 |
| Baysilone MA (1% in Solvesso 150) | flow improver (Bayer) | | 1.20 |
| Color-former | Selected from table above | | 0.5 (1% on solid) |
| Topanol CASF (Reference 1) | Latent acid generator (Rutherford Chemicals) | | 1.0 |
| Bisphenol-A (Reference 2) | Acidic phenole derivative (Fluka) | | 1.0 |

*DIN EN ISO 2114, values according to Technical Data Sheet of supplier
**DIN EN ISO 3682, value according to Material Safty Data Sheet of supplier Samples were applied with wire bar (wet film thickness 120 μm) and cured at 130° C. for 30 min.

2.3 Long Oil Alkyd System

| Substance | Supplier | Acid Value (solids) [mg KOH/g] | wt % |
|---|---|---|---|
| Worleekyd B870 | alkyd resin (Worlee Chemie) | Max. 15** | 80.0 |
| Varsol D30 | solvent (ExxonMobil Chemical) | | 17.5 |
| Exkin2 | anti skinning agent (CONDEA) | | 0.5 |
| Octa-Soligen Calcium 10 | siccative (Borchers) | | 1.0 |
| Octa-Soligen Zirkonium 6 | siccative (Borchers) | | 0.6 |
| Octa-Soligen Cobalt 6 | siccative (Borchers) | | 0.4 |
| Color Former CF1 | Selected from table above | | 0.6 (1% on solids) |

**DIN EN ISO 3682, values according Technical Data Sheet of supplier

Sample was applied with wire bar (wet film thickness 80 μm) and dried at room temperature for at least 24 h in a dark place.

Substrate for all applications: white pre-coated aluminum (Q-Panel QTY: 125)

3. Irradiation Conditions

The color was developed using different light sources and irradiation conditions:

3.1 UV-Curing Conditions:

Two medium pressure Hg-bulbs each 80 W/cm, line speed 10 m/min. Times of runs through machine were added up to total light exposure time (1 run=>6 s).

3.2 UV-A Exposure

Four UV-A fluorescent lamps with an UV-A emission peak at 340 nm. Permanent light exposure.

3.3 Daylight Lamps

Artificial daylight according to DIN 6173, partly containing UV-A light: Permanent light exposure.

4. Color Development Results

Color development was measured (along with exposure time) after light exposure using Minolta CM-2600 d color measurement equipment and calculated using the CIE-Lab formula. The values $L^*$; $a^*$ and $b^*$ represent the individual color in strength and shade.

4.1 UV-Curable System

All liquid formulations showed no color before irradiation with UV-light.

| color former | irradiation | Exposure time | $L^*$ | $a^*$ | $b^*$ |
|---|---|---|---|---|---|
| CF1 | UV-curing | <6 s | 72.5 | 16.4 | 42.5 |
| CF2 | UV-curing | <6 s | 85 | 2.6 | 6.1 |
| CF3 | UV-curing | <6 s | 89.4 | 1.5 | 14.2 |
| CF4 | UV-curing | <6 s | 89.7 | 2.3 | 14 |
| CF5 | UV-curing | <6 s | 90.9 | 0.7 | 9.4 |
| CF6 | UV-curing | <6 s | 89.6 | 3.2 | 13 |
| CF7 | UV-curing | <6 s | 88.8 | 7 | 14.9 |
| CF8 | UV-curing | <6 s | 91.5 | −7.2 | 56.6 |
| CF9 | UV-curing | <6 s | 84.1 | −7.9 | 43.2 |
| CF10 | UV-curing | <6 s | 82.8 | 4.5 | 32.3 |
| CF11 | UV-curing | <6 s | 90.1 | −2.6 | 41.1 |
| CF12 | UV-curing | <6 s | 89.6 | −5.6 | 29.8 |
| CF13 | UV-curing | <6 s | 86.1 | −5.3 | 29.8 |

-continued

| color former | irradiation | Exposure time | | L* | a* | b* |
|---|---|---|---|---|---|---|
| CF14 | UV-curing | <6 | s | 89.8 | 2 | 13.7 |
| CF15 | UV-curing | <6 | s | 78.5 | −8.5 | −9 |
| CF16 | UV-curing | <6 | s | 84.5 | 3.1 | 9.1 |
| CF17 | UV-curing | <6 | s | 88.3 | 4.6 | 14.3 |
| Reference 1 CF1 + Topanol CA-SF | UV-curing | <6 | s | 73.6 | 15.5 | 42.2 |

The CIE L* a* b* values show that all samples show significant coloration after irradiation. The presence of a photo-latent acid as in Reference 1 is not prerequisite for color development as the values above show.

4.2 Thermo Setting Acrylic System

All cured samples showed no significant coloration before irradiation.

| color former | irradiation | Exposure time | | L* | a* | b* |
|---|---|---|---|---|---|---|
| Substrate | | | | 92.5 | −0.8 | 1.3 |
| CF1 | UV-curing | <6 | s | 78.3 | 6 | 27.9 |
| | UV-A exposure | 2 | h | 73.5 | 1.6 | 24.7 |
| | Artificial daylight | 170 | h | 82.8 | −2 | 20.5 |
| CF2 | UV-curing | <6 | s | 89.3 | −0.4 | −0.6 |
| CF4 | UV-curing | <6 | s | 87.4 | −0.4 | 14.4 |
| | UV-A exposure | 50 | h | 90.2 | 0.7 | 4.1 |
| | Artificial daylight | 24 | h | 91.7 | −0.6 | 2.9 |
| CF7 | UV-curing | <6 | s | 88.5 | 11.2 | 7.8 |
| | UV-A exposure | 50 | h | 88.9 | 14.5 | 10.6 |
| | Artificial daylight | 24 | h | 91.1 | 5.8 | 3.6 |
| CF8 | UV-curing | <6 | s | 92 | −2.1 | 45.8 |
| | UV-A exposure | 50 | h | 91.2 | 0.3 | 5 |
| | Artificial daylight | 24 | h | 92.3 | −1.5 | 4.2 |
| CF9 | UV-curing | <6 | s | 80.3 | −0.8 | 18.9 |
| | UV-A exposure | 50 | h | 87.7 | 2.7 | 4.9 |
| | Artificial daylight | 24 | h | 90 | 0.3 | 4 |
| CF10 | UV-curing | <6 | s | 79.6 | 6.2 | 17 |
| | UV-A exposure | 50 | h | 87.5 | 4.5 | 4.8 |
| | Artificial daylight | 24 | h | 90.9 | 0.8 | 3.4 |
| CF11 | UV-curing | <6 | s | 88.1 | −5.1 | 5.1 |
| | UV-A exposure | 50 | h | 91.7 | 0.4 | 2.8 |
| | Artificial daylight | 24 | h | 92.1 | −0.8 | 1.5 |
| CF12 | UV-curing | <6 | s | 89.7 | −3.5 | 15.4 |
| | UV-A exposure | 50 | h | 90.8 | −0.3 | 4.1 |
| | Artificial daylight | 24 | h | 92.1 | −1.1 | 2.9 |
| CF13 | UV-curing | <6 | s | 84.4 | −2.2 | 24.1 |
| | UV-A exposure | 50 | h | 89.6 | 1.5 | 4.6 |
| | Artificial daylight | 24 | h | 91.7 | −1.1 | 4.4 |
| CF14 | UV-curing | <6 | s | 87.2 | −0.4 | 3.1 |
| | UV-A exposure | 50 | h | 90.1 | 0.9 | 15 |
| | Artificial daylight | 24 | h | 91.6 | −0.6 | 4.2 |
| CF16 | UV-curing | <6 | s | 84.5 | 3.1 | 9.1 |
| CF17 | UV-curing | <6 | s | 88.3 | 4.6 | 14.3 |
| Reference 1 CF1 + Topanol CA-SF | UV-curing | <6 | s | 77.3 | 6.2 | 28.6 |
| | UV-A exposure | 2 | h | 71.5 | 2.7 | 25.2 |
| | Artificial daylight | 170 | h | 82.8 | −2 | 20.5 |
| Reference 2 CF1 + Bisphenol-A | UV-curing | <6 | s | 77.8 | 6.2 | 28.4 |

The CIE L*a*b* values above show, that under UV-curing conditions all products tested show significant coloration without the presence of a photo-latent acid. The presence of an acid or acid-generator as in Reference 1 and 2 is not prerequisite for color development as the values above show.

All samples show a significant color change upon irradiation under UV-curing conditions if compared to substrate color values. CF1 and CF2 show coloration upon irradiation with longer wavelength light as UV-A light and artificial daylight.

4.3 Long Oil Alkyd System

The sample showed no significant coloration before irradiation.

| color former | irradiation | Exposure time | | L* | a* | b* |
|---|---|---|---|---|---|---|
| CF1 | UV-curing | <6 | s | 90.1 | −2.9 | 11.3 |
| | UV-A exposure | 1 | h | 90.8 | −3.5 | 6.8 |

The L a*b*-values clearly show that color is developed without using a developer.

The invention claimed is:

1. A method of irreversibly coloring a coating composition containing a color former comprising the steps of
   a) providing a coating composition that contains a thermosetting resin with the proviso that the coating composition contains no developer nor any additive which may function as developer;
   b) mixing the coating composition with the color former whereby no color is formed;
   c) applying the colorless composition obtained in step b) to a substrate;
   d) in case of a thermosetting resin other than an alkyd resin curing the resin between 100 and 300° C. whereby no color is formed, and in case of alkyd resin drying of the resin at room temperature, whereby no color is formed;
   e) exposure to UV or high energy radiation below 400nm whereby the color is formed.

2. A method according to claim 1, wherein the color former is selected from fluorans, triphenylmethanes, lactones, benzoxazines, spiropyrans and phthalides.

3. A method according to claim 2, wherein the color former is a fluoran.

4. A method according to claim 1, wherein the amount of color former in the coating composition is in the range of about 0.001 to 10% by weight.

5. A method according to claim 1, wherein the acid number of the coating composition is below 15 mgKOH/g.

6. A method according to claim 1, wherein the coating composition is an alkyd resin.

7. A method according to claim 1, wherein the thermosetting resin is a thermosetting resin other than an alkyd resin and in step d) is cured between 100 and 150° C.

8. A method according to claim 2, wherein the amount of color former in the coating composition is in the range of about 0.001 to 10% by weight.

9. A method according to claim 2, wherein the acid number of the coating composition is below 15 mgKOH/g.

10. A method according to claim 2, wherein the coating composition is an alkyd resin.

* * * * *